United States Patent
Padala et al.

(10) Patent No.: US 11,733,906 B2
(45) Date of Patent: Aug. 22, 2023

(54) METHODS, APPARATUSES, COMPUTER PROGRAMS AND COMPUTER PROGRAM PRODUCTS FOR DATA STORAGE

(71) Applicant: Telefonaktiebolaget LM Ericsson (publ), Stockholm (SE)

(72) Inventors: Chakri Padala, Bangalore (IN); Ganapathy Raman Madanagopal, Bengaluru (IN); Ashis Kumar Roy, Durgapur (IN); Dinesh Yadav, Rajasthan (IN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 367 days.

(21) Appl. No.: 16/762,016

(22) PCT Filed: Nov. 9, 2017

(86) PCT No.: PCT/IN2017/050516
§ 371 (c)(1),
(2) Date: May 6, 2020

(87) PCT Pub. No.: WO2019/092733
PCT Pub. Date: May 16, 2019

(65) Prior Publication Data
US 2021/0373768 A1    Dec. 2, 2021

(51) Int. Cl.
*G06F 3/06* (2006.01)
*H03M 7/30* (2006.01)

(52) U.S. Cl.
CPC ............... *G06F 3/065* (2013.01); *G06F 3/067* (2013.01); *G06F 3/0608* (2013.01); *H03M 7/607* (2013.01)

(58) Field of Classification Search
CPC ........ G06F 3/065; G06F 3/0608; G06F 3/067; G06F 3/061; G06F 3/0643; G06F 3/0629; G06F 3/0634; H03M 7/607; H03M 7/6064; H03M 7/6076; H03M 7/6082; H03M 7/6088; H03M 7/6094; H04L 67/1095;
(Continued)

(56) References Cited

U.S. PATENT DOCUMENTS 8,738,857 B1    5/2014 Clark et al.
9,973,210 B1 *  5/2018 Mahony .............. H03M 7/3086
(Continued)

FOREIGN PATENT DOCUMENTS

WO    2007/127246 A2    11/2007

OTHER PUBLICATIONS

HyComp: A Hybrid Cache Compression Method for Selection of Data-Type-Specific Compression Methods by Aelakis (Year: 2015).*
(Continued)

*Primary Examiner* — Paul M Knight
(74) *Attorney, Agent, or Firm* — Rothwell, Figg, Ernst & Manbeck, P.C.

(57) ABSTRACT

A data storage system in which different copies of a data object (e.g., a file) can be compressed using different compression processes (e.g. different compression algorithms/processes and/or compression parameters), with some favoring faster decompression, while others favoring storage space savings. When a data object needs to be accessed, the copy of the data object that can be decompressed using minimal resource (computing and/or time) can be located and retrieved.

13 Claims, 6 Drawing Sheets

(58) Field of Classification Search
CPC . H04L 67/2828; H04L 69/04; H04L 67/1097; H04L 67/06
See application file for complete search history.

(56) References Cited

U.S. PATENT DOCUMENTS

| | | | |
|---|---|---|---|
| 10,223,008 B1* | 3/2019 | Bigman | G06F 3/0661 |
| 2003/0097454 A1* | 5/2003 | Yamakawa | H04L 61/457 |
| | | | 709/229 |
| 2009/0037512 A1 | 2/2009 | Barsness et al. | |
| 2009/0259675 A1* | 10/2009 | Hamilton | G06F 16/1744 |
| 2012/0233117 A1 | 9/2012 | Holt et al. | |
| 2012/0275424 A1* | 11/2012 | Chen | H03M 7/6011 |
| | | | 370/466 |

OTHER PUBLICATIONS

International Search Report and Written Opinion dated Jan. 11, 2018 issued in international Patent Application No. PCT/IN2017/050516. (9 pages).
Erasure Coding Definition (last updated Nov. 2014), Tech Target (searchstorage.techtarget.com/definition/erasure-coding). (3 pages).

* cited by examiner

METHODS, APPARATUSES, COMPUTER PROGRAMS AND COMPUTER PROGRAM PRODUCTS FOR DATA STORAGE

CROSS REFERENCE TO RELATED APPLICATION(S)

This application is a 35 U.S.C. § 371 National Stage of International Patent Application No. PCT/IN2017/050516, filed Nov. 9, 2017, designating the United States.

TECHNICAL FIELD

Disclosed are embodiments related to data storage (e.g., data storage in a data center environment).

BACKGROUND

To conserve storage space, conventional storage systems have the capability to compress data objects (e.g., files) and store the compressed data objects instead of the original, uncompressed data object. Depending on the type of data object being compressed, the storage system may employ a lossless a non-lossless (i.e., lossy) compression algorithm (e.g., photographs, video, and audio files are usually compressed using a non-lossless compression algorithm). Additionally, some storage systems allow an administrator to specify the compression process (e.g., compression algorithm and compression parameters) to be used by the storage system. Some compression processes provide more compression than other compression processes (e.g., a certain class of lossless compression algorithms/processes may have a compression ratio that is higher than other classes of lossless compression algorithms/processes), but these compression processes that provide a high compression factor typically require more processing resources and/or have a higher latency, such as the amount of time needed to decompress the object to obtain the original, uncompressed object. Accordingly, there is usually a tradeoff between compression ratio and resource utilization.

In cloud based software defined storage (SDS) systems, an off-the-shelf computer server may be paired with a storage device (e.g., hard drive, flash memory, etc.) to provide a storage node. The SDS system may have several such storage nodes. Each of these storage nodes may define multiple storage volumes (i.e., logical storage containers) providing storage services to different tenants/applications. Each of the storage volumes (or "volumes" for short) can be configured to have different characteristics.

SUMMARY

Cloud systems typically store multiple copies of a file in different storage nodes for redundancy, proximity and fault tolerance reasons. In such cloud systems, each copy of the file is compressed using the same compression process (e.g., the same compression algorithm and compression parameters). This while serving the original goals of multiple copies does not add any additional benefit for compressed files and increases the energy usage when highly compressed files are frequently decompressed for access.

This disclosure describes a data storage system in which different copies of a file are compressed using different compression processes (e.g. different compression algorithms/processes and/or compression parameters), with some favoring faster decompression, while others favoring storage space savings. When a file needs to be accessed, the copy of the file that can be decompressed using minimal resource (computing and/or time) can be located and retrieved.

An advantage of such a data storage system include: it provides a better user experience because the right compressed file is chosen based on the current system resources during the decompression.

In some embodiments, compressed files are monitored for usage and if they have not been accessed within a certain period of time, then they may be compressed again using a process that has a higher compression ratio. This provides an advantage of being energy efficient and CPU friendly as it enables fine tuning of the compression level assigned to a storage node (or a storage volume managed by the storage node) based on access—i.e., more frequently access node/volume are re-compressed with a lower compression level and the less frequently accessed files are re-compressed with higher compression level.

In one aspect there is provided a method for storing a data object. In some embodiments the method includes the storage obtaining the data object. In response to obtaining the data object, the storage controller: determines a first storage node (102a) for storing a first copy of the data object; determines a second storage node (102b) for storing a second copy of the data object; provides the first copy of the data object to the first storage node; and provides the second copy of the data object to the second storage node. The method further includes: the first storage node determining a first compression process for use in compressing the first copy of the data object and the second storage node determining a second compression process for use in compressing the second copy of the data object, wherein the second compression process is different than the first compression process. The first storage node uses the first compression process to compress the first copy of the data object, thereby producing a first compressed version of the data object. The second storage node uses the second compression process to compress the second copy of the data object, thereby producing a second compressed version of the data object, wherein the second compression process is computationally simpler than the first compression process. That is, the second compression process requires fewer resources than the first compression process, such as, for example, time resources, memory resources and/or processing resources. For example, the second compress process may be computationally simpler than the first compression process in that the second compression process is able to compress a particular data object more quickly than the first compression process can compress the particular data object. The first compressed version of the data object is stored in a first non-transitory computer readable medium; and the second compressed version of the data object is stored in in a second non-transitory computer readable medium.

In another aspect there is provided a method for optimizing storage resources. In some embodiments the method includes receiving, at a storage controller, a storage volume creation request. After receiving the storage volume creation request, the storage controller selects a plurality of storage nodes based on the storage volume creation request, the plurality of storage nodes comprising a first storage node comprising a first set of one or more volumes and a second storage node comprising a second set of one or more volumes, wherein each volume included in the first set of volumes has a compression level and each volume included in the second set of volumes has a compression level. A first new volume is created on the first storage node and a compression level for the first new volume is set based on the compression levels of the volumes included in the first set of volumes. A second new volume is created on the second storage node and a compression level for the second new volume is set based on the compression levels of the volumes included in the second set of volumes. For example, if, on average, the compression level for the volumes included in the first set of volumes is a high compression level, then the compression level for the first new volume may be set to a low compression level to optimize computing and storage resources, the same applies to the second new volume.

BRIEF DESCRIPTION OF THE DRAWINGS

The accompanying drawings, which are incorporated herein and form part of the specification, illustrate various embodiments.

DETAILED DESCRIPTION

Figure 1:
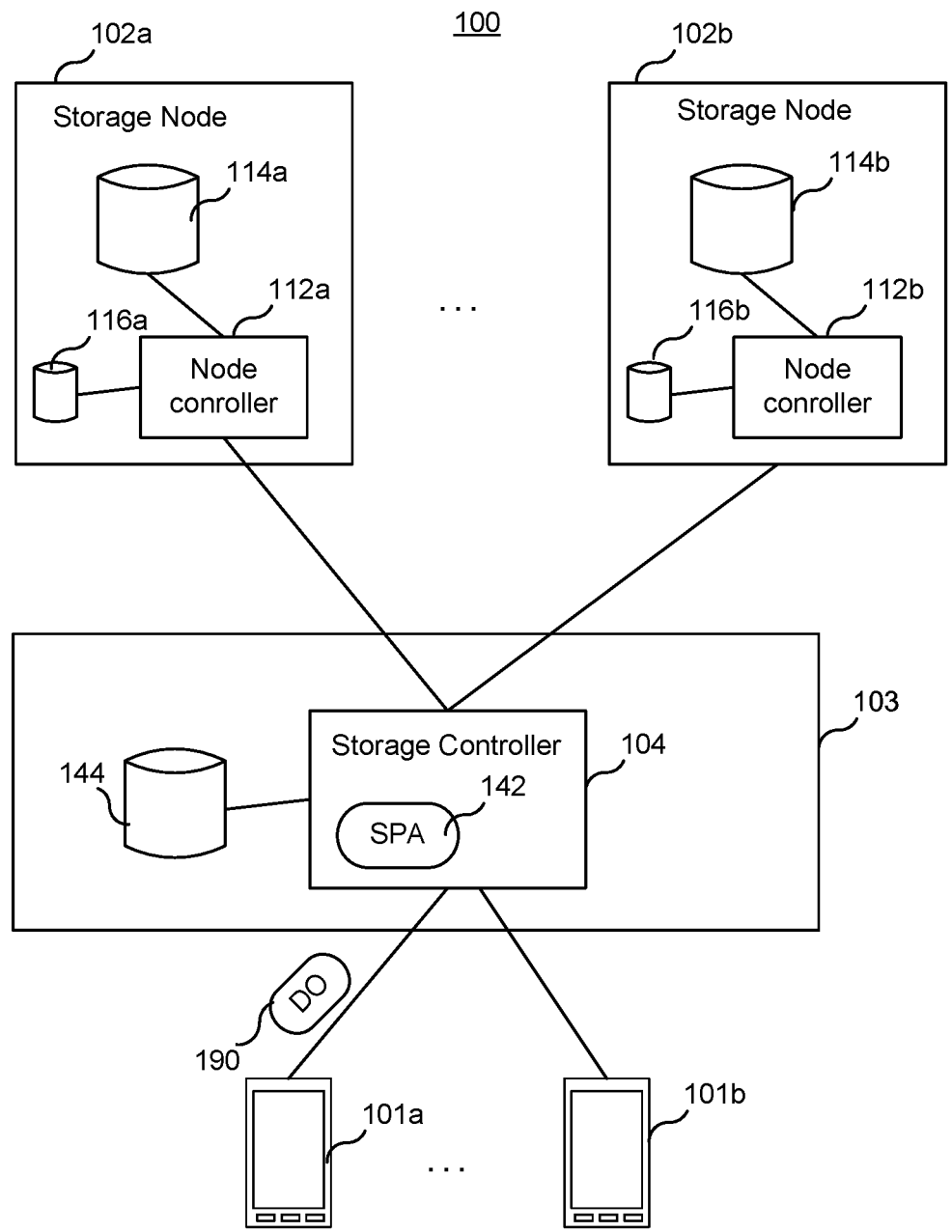
FIG. 1 illustrates an exemplary data storage system.

FIG. 1 illustrates a data storage system 100 according to some embodiments. Data storage system 100 includes a differential compression recommendation system 103, which includes a storage controller 104. Data storage system 100 also includes a plurality of storage nodes (storage nodes 102a and 102b are shown for illustration), each of which is communicatively coupled to storage controller 104. Storage controller 104 may be implemented using a single computer or it may be implemented using a distributed computing system comprising a plurality of computers, which may or may not be co-located. Storage controller 104 is also communicatively coupled to a plurality of clients (clients 101a and 101b are shown for illustration). Storage controller 104 functions to receive data objects from clients (e.g., data object 190 from client 101a) and to store the data object in one or more of the storage nodes. Storage controller 104 also functions to receive data retrieval requests from clients, retrieve the requested data object and provide the retrieved data object to the requesting client. While the clients shown in FIG. 1 are illustrated as being mobile devices, a client may be mobile or non-mobile (e.g., a client may be a desktop computer, a server, a mainframe, etc.).

Storage Nodes

As illustrated in FIG. 1, a storage node includes one or more physical storage mediums (see e.g., elements 114a and 114b of storage nodes 102a and 102b, respectively) of possibly varying storage capacity and access latency for storing data objects. Each physical storage medium 114a, 114b may comprise a hard disk drive (HDD) and/or a solid-state drive (SSD) and/or other storage medium (e.g., an optical medium, medium or non-volatile memory sitting in a memory slot, etc.). Each storage node also includes a node controller (see e.g., elements 112a and 112b of storage nodes 102a and 102b, respectively). Node controllers 112a and 112b are operable to divide a physical storage medium into one or more logical storage containers (a.k.a., "storage volumes" for volumes for short) and utilize these volumes to store data objects in response to requests from storage controller 104.

More specifically, for example, the node controller is configured such that, in response to a request from storage controller 104 to store a data object, the node controller: determines a volume in which the data object will be stored (e.g., the volume may be specified in the request), determines a compression process for compressing the data object (e.g., the compression process may be determined based on the determined volume), and either i) compresses the data object using the determined compression process (assuming the node controller has sufficient resources to handle the compression) and stores the compressed data object in the determined volume or ii) adds to a compression job queue a compression job for compressing the data object using the determined compression process.

Accordingly, in some embodiments, the storage nodes further include a local database (see e.g., elements 116a and 116b of storage nodes 102a and 102b, respectively) for storing, among other things, job queues (e.g., the compression job queue mentioned above, a decompression job queue, etc.) and compression configuration information that associates compression process identifiers with volume identifiers (e.g., a set of records wherein each record includes a first field for storing a volume identifier (i.e., an identifier for identifying a volume, such as, for example, a volume name) and a second field for storing a compression process identifier (i.e., an identifier for identifying a compression process), thereby associating the compression process identifier with the volume identifier).

Each local database 116a and 116b may further be employed to store meta-data regarding the data objects stored by node controller 112a and 112b, respectively. The meta-data for a data object may include information regarding the point in time at which the data object was last accessed.

The Differential Compression Recommendation System 103

The differential compression recommendation system 103 includes, as noted above, storage controller 104. System 103 also includes a system resources database 144, and a system performance analyzer 142, which is a software tool running on storage controller 104.

Storage Controller 104

In some embodiments, storage controller 104 is an entity that controls and manages a set of storage nodes. Typically, a datacenter consist of multiple storage domains and single or multiple storage controllers can control them. Storage controller 104 performs operations such as: selecting the storage node volumes that will be used to provide storage services to a tenant, assigning compression level to each volume, monitoring of storage nodes. In some storage schemes, the storage controller is used to figure out the location of objects and in others, a client performs some calculations based on things such as the object name to figure out the location.

In some embodiments, storage controller 104 is used to select the storage node from which a requested object will be retrieved (based on, for example, the current system resources). Sometimes a hash-based scheme on the client is used to perform the selection of storage node instead of using the controller. In that scenario, storage controller 102 could build this information and makes it available to the clients.

System Resources Database 144

In some embodiments, system resource database 144 contains both historical and current system resource information, namely: 1) inventory information for each storage node (e.g., number of Central Processing Units (CPUs), Network Interface Controllers (NICs), Random Access Memory (RAM), storage on for the storage node); 2) configuration information for each storage node (e.g., volumes configured on the storage node and the associated compression algorithms/processes); and 2) utilization information for each storage node (e.g., the storage node's CPU utilization, available memory, available network bandwidth, available storage capacity, per volume utilization, number of types a volume is accessed on a given node etc). Preferably, the utilization information is updated at regular intervals.

System Performance Analyzer (SPA) 142

In some embodiments, SPA 142, among other things, provides the utilization information for database 144. In other embodiment (e.g. a distributed scheme), SPA 142 provides the utilization information to clients. SPA 142 may also be used to enable new volume creation based on existing usage and new requirements.

Storage Node Management Processes

In some embodiments, an administrator or other entity may issue to storage controller 104 a first storage volume creation request for creating a new storage volume. The issued request may indicate a redundancy level (e.g., the minimum number of storage nodes to employ). Storage controller 104 may employ SPA 142 to select a set of storage nodes for storing the data intended for the storage volume. Storage controller 104 may assign a unique storage volume identifier to the selected set of storage nodes. That is, storage controller 104 may store a storage volume identifier in association with information that identifies the set of storage nodes.

SPA 144 may select the set of storage nodes using the configuration and utilization information and the requested redundancy level (e.g., if the redundancy level is "5", then SPA 144 will select at least five storage nodes that have the correct configuration and are not currently over utilized). After the SPA 142 selects the set of storage nodes, storage controller 104, for each selected storage node, sends to the storage node a second storage volume creation request. In some embodiments, the storage volume creation request transmitted by SPA 142 to each selected storage node includes: the assigned storage volume identifier, a storage size (e.g., 100 Gigabytes) and a compression process identifier for identifying a compression process to be employed by the node controller of the storage node to compress the data objects destined for the volume. In other embodiments, the storage volume creation request sent by SPA 142 to a particular selected storage node includes the storage volume identifier and the storage size but not the compression process identifier. In such embodiments, the storage node is already configured with a compression process identifier identifying a compression process to be employed by the node controller of the storage node to compress the data objects destined for the volume.

In embodiments in which the storage controller 104 includes the compression process identifier in the storage volume creation request sent to a storage node, the storage controller 104 may select the compression process identifier based on the configuration and/or utilization information for the storage node. For example: a storage node with lots of storage but low CPU might be given a compression process identifier that identifies a "low" compression process (i.e., a compression process that produces a low compression ratio).

On the other hand, a storage node with hardware-enabled compression (e.g., a storage node with a hardware compression accelerator) may be given a compression process identifier that identifies a "high" compression process suitable to be implemented by the hardware-enabled compression. The storage controller 104 can also actively manage the data storage system 100 by moving CPU intensive compression algorithms/processes to storage nodes having such a hardware compression accelerator.

In some embodiments, the compression processes selected for a storage node may also be selected based on the location of storage node. For example, if the selected set of storage nodes includes a first storage node located in a first rack and a second storage node that is also located in the first rack, then a low compression process may be selected for one of the storage nodes while a high compression process is selected for the other storage node.

In response to receiving a storage volume creation request transmitted by storage controller 104, the storage node creates a new volume (e.g., allocates space on the storage nodes' physical storage medium) and updates its local database such that the storage volume identifier is associated with the newly created volume as well as the compression process identifier, if any, included in the request. In this way, when the storage node receives a data storage request containing a volume identifier, the storage node can use the volume identifier to determine the compression process to use for the data object to be stored (i.e. the compression process identified by the compression process identifier associated with the volume identifier) and find the correct volume in which the compressed data object should be stored.

Data Storage Processes

In some embodiments, when a client has a data object (e.g., file) that it would like to have stored within the data storage system 100, the client may send to storage controller 104 a data storage request along with the data object. The data storage request may include a storage volume identifier for identifying the storage volume onto which the data object should be stored. Alternatively, the storage controller 104 can derive a storage volume identifier based on information about the client that sent the request.

Storage controller 104 then uses the storage volume identifier associated with the request to determine the set of storage nodes associated with the storage volume identifier (e.g., a set of storage node that includes storage nodes 102*a* and/or 102*b*). Next, storage controller 104 sends to each storage node included in the set a data storage request along with the data object. The data storage request sent by storage controller 104 to each storage node preferably includes the storage volume identifier so that the storage node will be able to determine the volume into which the data object should be stored (as well as the compression process, if any, to employ).

When a storage node (e.g. storage node 102*a* or 102*b*) receives such a data storage request from storage controller 104, the storage node (e.g. storage node 102*a* or 102*b*) uses the storage volume identifier to retrieve from its local database (e.g., local database 116*a*) the compression process identifier associated with the volume identifier, thereby determining the compression process to use. The storage node (e.g. storage node 102*a* or 102*b*) then determines whether it currently has sufficient resources to perform the compression process. If the storage node (e.g. storage node 102*a* or 102*b*) has sufficient resources, the data object is compressed and stored in a volume associated with the volume identifier. If the current resources are not sufficient, the data object is stored as is and the storage node's local database (e.g. local database 116a) is updated to indicate future compression is necessary.

Data Retrieval Processes

In some embodiments, when a client need to retrieve a data object from data storage system 100, the client selects one of the storage nodes (e.g., storage node 102a or 102b) that has a copy of the data object based on proximity and resource availability and then sends to the selected storage node a data retrieval request identifying the data object (e.g., identifying the volume in which the data object is stored and the path of the data object within the volume). In other embodiments, when the client needs to retrieve a data object the client may send to a name server (which may be a component of storage controller 104) the name of the data object, and the name server selects one of the storage nodes (e.g., storage node 102a or 102b) that has a copy of the data object based on proximity, resource availability, and/or compression level. The name server then returns to the client the contact information (e.g., domain name, IP address) for the selected storage node (e.g., storage node 102a or 102b) so that the client can send the data retrieval request to the selected storage node (e.g., storage node 102a or 102b).

Upon receipt of the data retrieval request, the storage node (e.g., storage node 102a or 102b) retrieves from its local database (e.g., local database 116a if storage node 102a is the selected storage node) the metadata for the requested data object, which includes compression information (e.g., compression process identifier) indicating the compression process that was used to compress the data object. Once this is compression information is determined, the storage node (e.g., storage node 102a or 102b) can select the appropriate decompression process to decompress the object. After the object is decompressed, the object is sent to the client. Additionally, the local database in the storage node (e.g., local database 116a if storage node 102a is the selected storage node) may be updated at that point to indicate the date/time the object was accessed.

Background Compression Maintenance:

In some embodiments, each storage node's local database (e.g., local database 116a belonging to storage node 102a) is scanned for files requiring compression and are compressed to the desired compression level. Additionally, data objects stored in a storage node (e.g., storage node 102a or 102b) that are not accessed for a long duration are automatically compressed to higher compression form irrespective of the configuration for the given copy of the volume and the storage node's local database is updated with information indicating the new compression level for the data objects (e.g., the information can be a compression process identifier). Also, in some embodiments, when a storage node's amount of free storage falls below a threshold, one or more data objects may be automatically compressed to a higher compression level and the storage node's local database updated within information indicating the new compression level.

In some embodiments, it is possible that clients can prioritize a highly compressed volume copy (for example, because the storage node containing the lowly compressed volume is always at a higher CPU) then system allows for migration of copies of volumes between the existing storage nodes. This is done over time either automatically or manually based on configuration.

Energy Efficiency

In some embodiments, higher compression is assigned to storage nodes with lower utilization, thereby reducing the peak energy utilized by each node. Doing higher compression in background when nodes are at a lower utilization also helps this. Frequently accessed files are compressed to a lower compression level (e.g., no compression or very low compression) thus saving energy.

Configuring the System

As part of configuration, an administrator can configure a client specific compression policy. For example, a client specific compression policy may indicate that one or more automatic optimization features should be enabled for the client (e.g., automatic optimization of storage space and/or CPU utilization)

Figure 2:
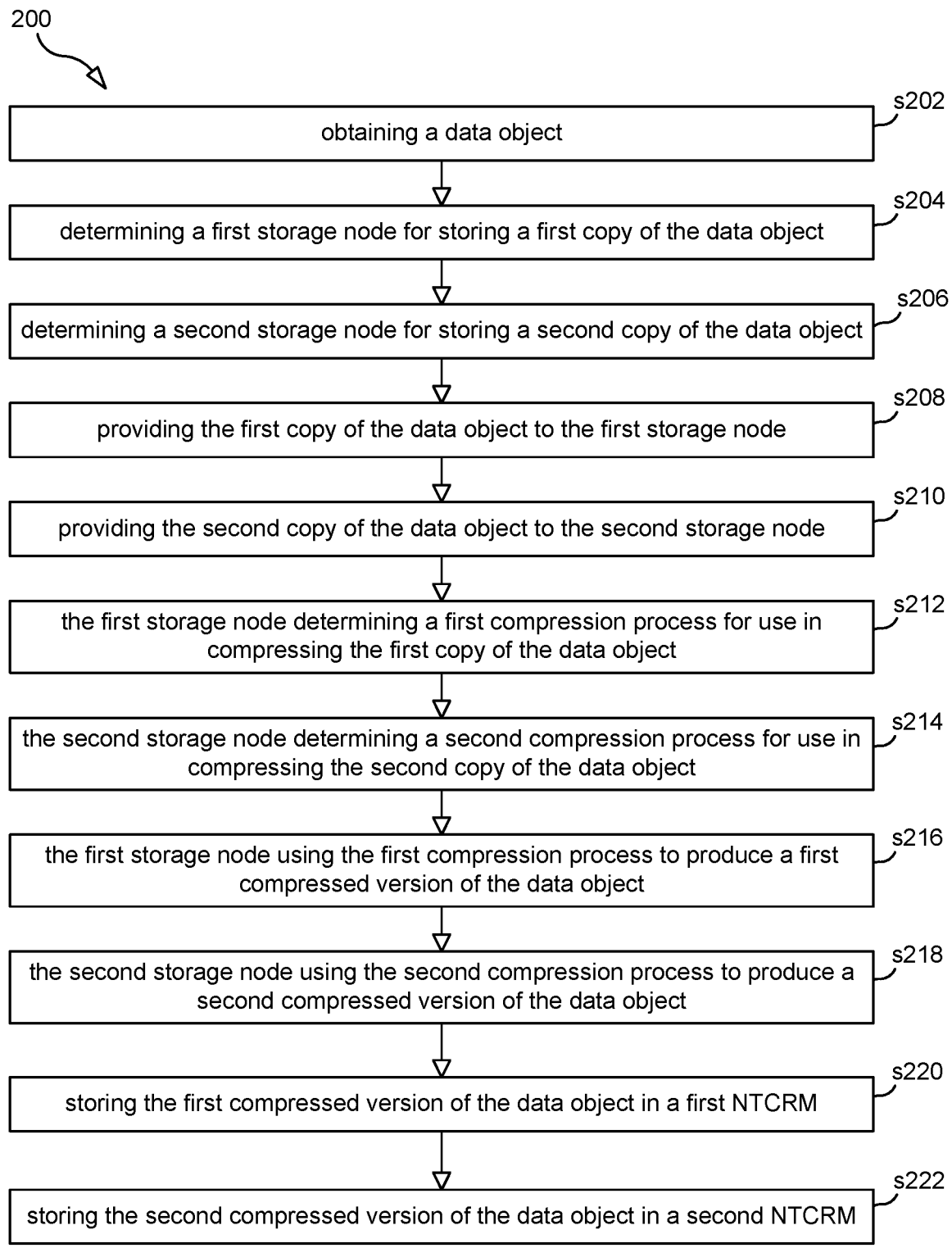
FIG. 2 is a flow chart illustrating a process according to some embodiments.

FIG. 2 is a flow chart illustrating a process 200, according to some embodiments, for the redundant storage of a data object (e.g., DO 190, which may be a file). Process 200 is performed by data storage system 100. Process 200 may begin with step s202 in which storage controller 104 obtains the data object (e.g., receives the data object from a client). In response to obtaining the data object, storage controller 104 performs steps s204-s210.

In step s204, storage controller 104 determines a first storage node (e.g., storage node 102a) for storing a first copy of the data object (e.g., a first compressed version of the data object).

In step s206, storage controller 104 determines a second storage node (e.g., storage node 102b) for storing a second copy of the data object (e.g., a second compressed version of the data object, or an uncompressed version of the data object).

In step s208, storage controller 104 provides the first copy of the data object to the first storage node.

In step s210, storage controller 104 provides the second copy of the data object to the second storage node.

In step s212, the first storage node determines a first compression process for use in compressing the first copy of the data object.

In step s214, the second storage node determines a second compression process for use in compressing the second copy of the data object, wherein the second compression process is different than the first compression process.

In step s216, the first storage node uses the first compression process to compress the first copy of the data object, thereby producing a first compressed version of the data object.

In step s218, the second storage node uses the second compression process to compress the second copy of the data object, thereby producing a second compressed version of the data object, wherein the second compression process is computationally simpler than the first compression process. That is, the second compression process requires fewer resources than the first compression process, such as, for example, time resources, memory resources and/or processing resources. For example, the second compress process may be computationally simpler than the first compression process in that the second compression process is able to compress a particular data object more quickly than the first compression process can compress the particular data object.

In step s220, the first compressed version of the data object is stored in a first non-transitory computer readable medium (NTCRM) (e.g., medium 114a).

In step s222, the second compressed version of the data object is stored in a second non-transitory computer readable medium (e.g., medium 114b).

In some embodiments, process 200 further includes storage controller 104 providing to the first storage node a storage container identifier (e.g., a storage volume identifier) identifying a storage container (e.g., identifying storage volume), wherein the first storage node uses the storage container identifier to obtain from a first database (e.g., database 116*a*) a first compression process identifier associated with the storage container identifier, and uses the first compression process identifier to determine the first compression process. In such an embodiment, process 200 may further include storage controller 104 providing to the second storage node the same storage container identifier that was provided to the first storage node, wherein the second storage node uses the storage container identifier to obtain from a second database (e.g., database 116*b*) a second compression process identifier associated with the storage container identifier, and uses the second compression process identifier to determine the second compression process. In such an embodiment, the storage container identifier and the first copy of the data object are provided to the first storage node at substantially the same time, and the storage container identifier and the second copy of the data object are provided to the second storage node at substantially the same time.

In some embodiments, process 200 further includes, storage controller 104 configuring the first storage node and the second storage node prior to the storage controller 104 obtaining the data object. In some embodiments, configuring the first storage node comprises causing the first storage node to associate the storage container identifier with the first compression process identifier; and configuring the second storage node comprises causing the second storage node to associate the storage container identifier with the second compression process identifier.

In some embodiments, process 200 further includes storage controller 104 selecting the first compression process from a set of two or more available compression processes prior to providing the first copy of the data object to the first storage node. In such an embodiment the step of providing the first copy of the data object to the first storage node may include transmitting to the first storage node the first copy of the data object and a first compression process identifier identifying the first compression process, and the first storage node determines the first compression process based on the first compression process identifier. In some embodiments, the step of selecting the first compression process comprises storage node 104 selecting the first compression process based on one or more of: an attribute of the data object, current system resource availability, and predicted system resource availability.

In some embodiments, process 200 further includes the first storage node determines whether it has sufficient resources to compress the first copy of the data object using the first compression process prior to the first storage node using the first compression process to compress the first copy of the data object. In some embodiments, as a result of determining that the first storage node does not have sufficient resources to compress the first copy of the data object using the first compression process, the first storage node stores the first copy of the data object in the first non-transitory computer readable medium (e.g., medium 114*a*) and, after the first storage node stores the first copy of the data object in the first non-transitory computer readable medium, the first storage node uses the first compression process to compress the first copy of the data object, thereby producing the first compressed version of the data object.

In some embodiments, process 200 further includes data storage system 100 receiving a request for the data object and, in response to receiving the request for the data object, selecting a storage node from a set of storage nodes, wherein each storage node included in the set of storage nodes stores a copy of the data object. In such embodiments, the data object is retrieved from the selected storage node. In some embodiments, the storage node is selected based on one or more of: the compression level at which the data object is stored on the selected storage node and a network access time for accessing the selected storage node.

In some embodiments, process 200 further includes at least one of storage node 102*a* and 102*b* scanning its associated storage medium(s) to identify files requiring compression, and, for each identified file requiring compression, compressing the identified file.

In some embodiments, process 200 further includes at least one of storage node 102*a* and 102*b* scanning its associated storage medium(s) to identify files that have not been accessed since a predetermined prior point in time, and, for each identified file that has not been accessed since the predetermined prior point in time, compressing the identified file.

In some embodiments, process 200 further includes determining that a storage level of the first storage node has exceeded a storage level threshold, and as a result of determining that the storage level of the first storage node has exceeded the storage level threshold, compressing a file stored in the first storage node to a higher compression level.

Figure 3:
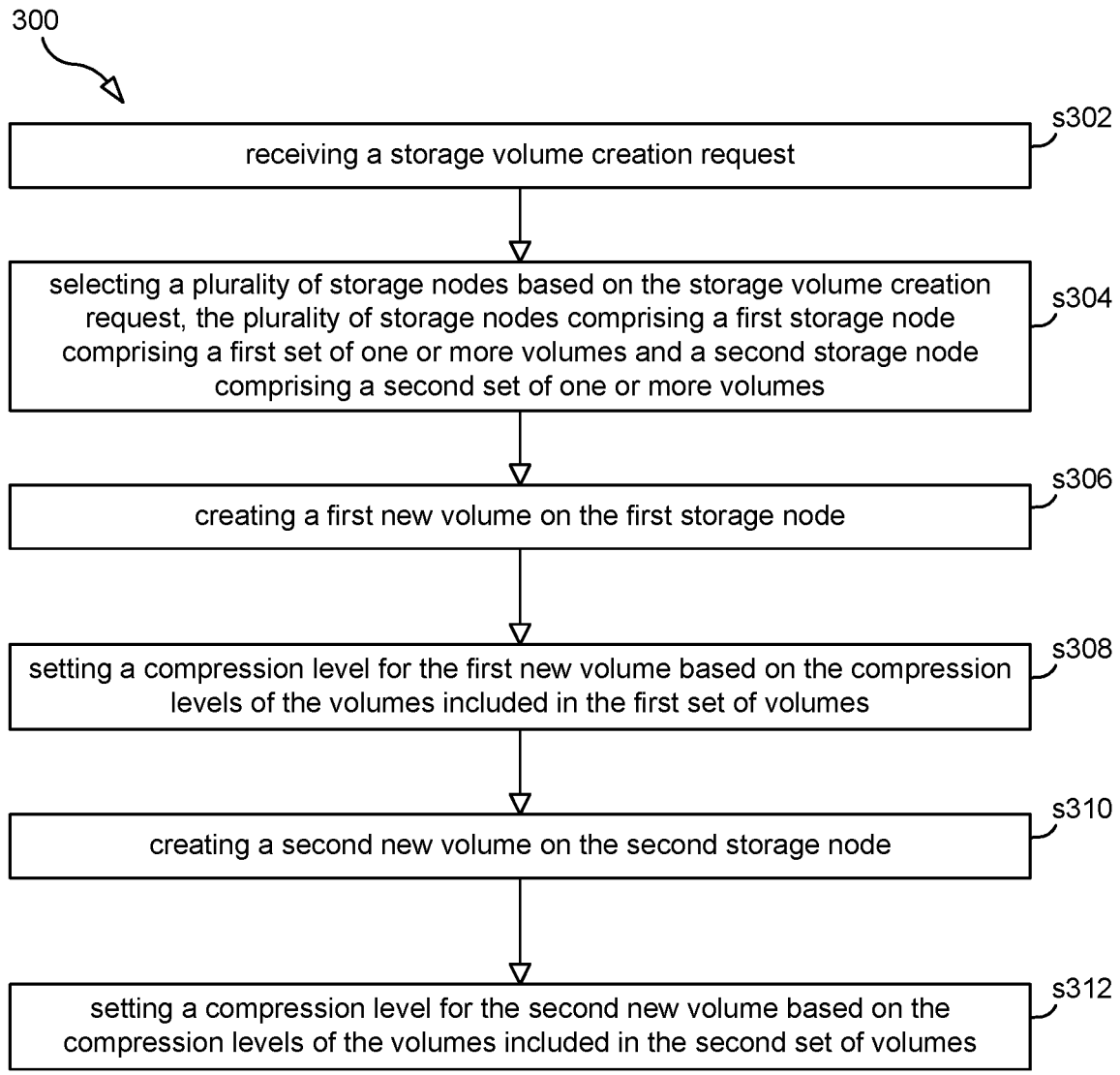
FIG. 3 is a flow chart illustrating a process according to some embodiments.

FIG. 3 is a flow chart illustrating a process 300, according to some embodiments, for optimizing storage resources. Process 300 may begin with step s302 in which storage controller 104 receives a storage volume creation request. In some embodiments, the storage volume creation request includes information specifying a redundancy level. After receiving the storage volume creation request storage controller 104 selects a set of two or more storage nodes based on the storage volume creation request (step s304). For example, where the redundancy level is specified in the storage volume creation request, the step of selecting the storage nodes based on the storage volume creation request may comprise selecting the number of storage nodes to include in the set based on the redundancy level. In some embodiments, the storage volume creation request further includes at least one of: size information specifying required volume size and file system format information identifying a file system format.

The selected set of storage nodes comprises a first storage node (e.g., storage node 102*a*) comprising a first set of one or more volumes and a second storage node (e.g. storage node 102*b*) comprising a second set of one or more volumes, wherein each volume included in the first set of volumes has a compression level and each volume included in the second set of volumes has a compression level.

In step s306, a first new volume is created on the first storage node. For example, in step s306 storage controller 104 sends to the first storage node a command to create a new volume. In step s308, a compression level for the first new volume is set based on the compression levels of the volumes included in the first set of volumes. In step s310, a second new volume is created on the second storage node (e.g., in step s310 storage controller 104 sends to the second storage node a command to create a new volume). In step s312 a compression level for the second new volume is set based on the compression levels of the volumes included in the second set of volumes.

Figure 4:
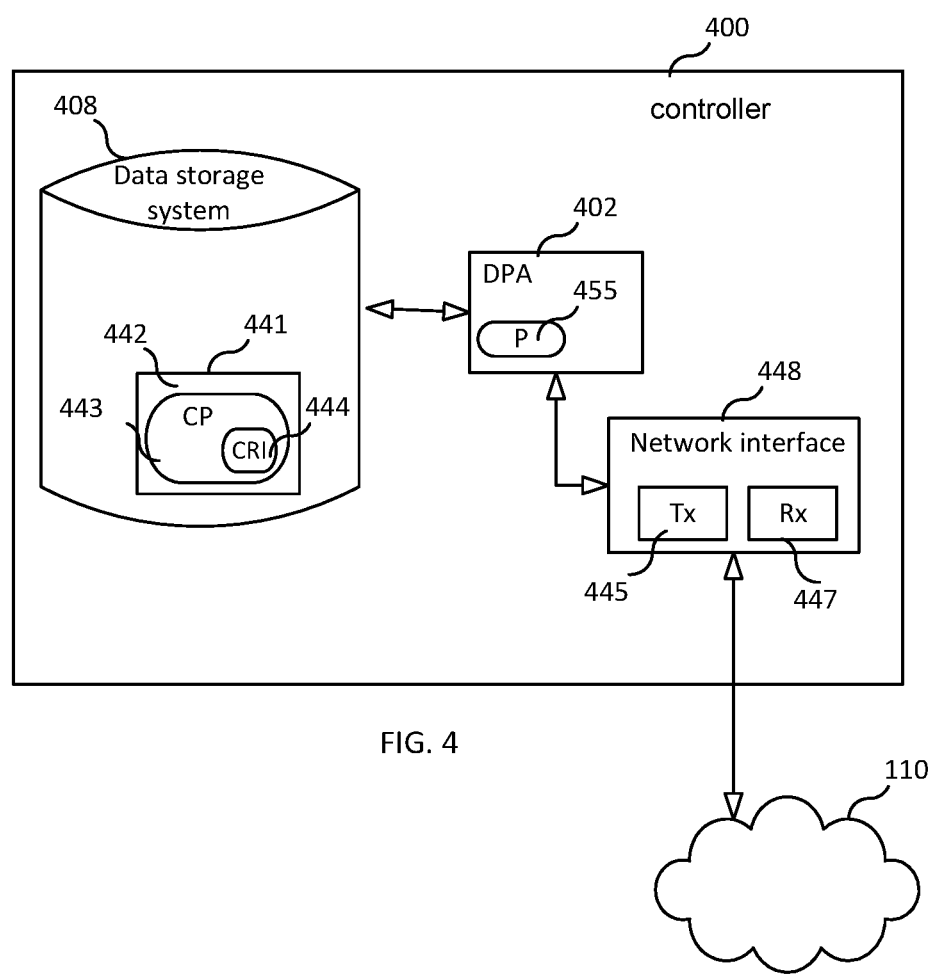
FIG. 4 is a block diagram of a controller according to some embodiments.

FIG. 4 is a block diagram of an example controller 400 according to some embodiments, which can function as a storage controller 104 and/or a node controller 112. As shown in FIG. 4, controller 400 may comprise: a data processing apparatus (DPA) 402, which may include one or more processors (P) 455 (e.g., a general purpose microprocessor and/or one or more other processors, such as an application specific integrated circuit (ASIC), field-programmable gate arrays (FPGAs), and the like); a network interface 448 comprising a transmitter (Tx) 445 and a receiver (Rx) 447 for enabling the controller 400 to transmit data to and receive data from other nodes connected to a network 110 (e.g., an Internet Protocol (IP) network) to which network interface 448 is connected; and local storage unit (a.k.a., "data storage system") 408, which may include one or more non-volatile storage devices and/or one or more volatile storage devices (e.g., random access memory (RAM)). In embodiments where DPA 402 includes a programmable processor, a computer program product (CPP) 441 may be provided. CPP 441 includes a computer readable medium (CRM) 442 storing a computer program (CP) 443 comprising computer readable instructions (CRI) 444. CRM 442 may be a non-transitory computer readable medium, such as, but not limited, to magnetic media (e.g., a hard disk), optical media, memory devices (e.g., random access memory, flash memory), and the like. In some embodiments, the CRI 444 of computer program 443 is configured such that when executed by data processing apparatus 402, the CRI causes controller 400 to perform steps described herein (e.g., steps described herein with reference to the flow charts). In other embodiments, controller 400 may be configured to perform steps described herein without the need for code. That is, for example, DPA 402 may consist merely of one or more ASICs. Hence, the features of the embodiments described herein may be implemented in hardware and/or software.

Figure 5:
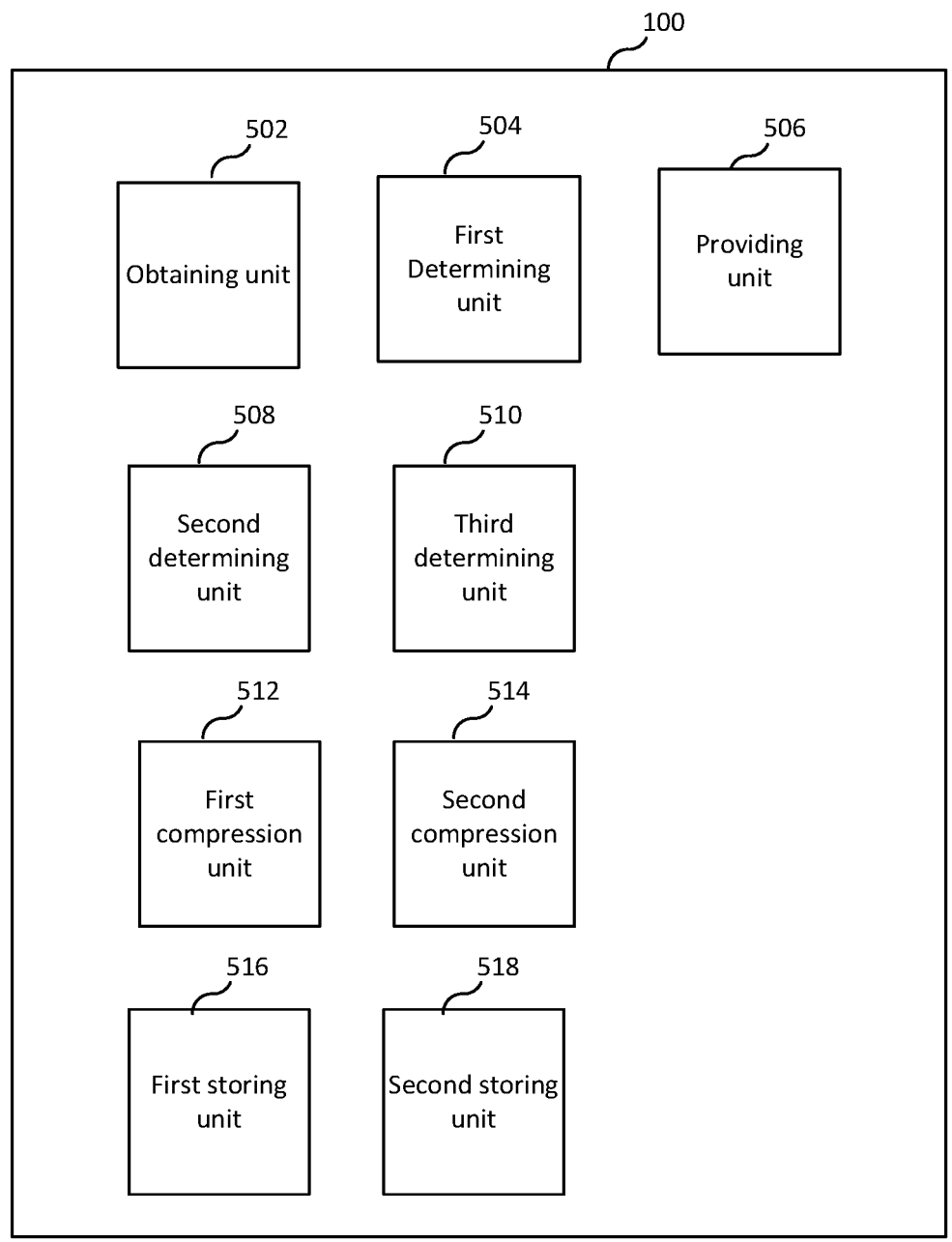
FIG. 5 is a diagram showing functional modules of a data storage system according to some embodiments.

FIG. 5 is a diagram showing functional modules of data storage system 100 according to some embodiments. As shown in FIG. 5, data storage system 100 in some embodiments includes: an obtaining unit 502, a first determining unit 504, a providing unit 506, a second determining unit 508, a third determining unit 510, a first compression unit 512, a second compression unit 514, a first storing unit 516, and a second storing unit 518.

The obtaining unit 502 is configured to obtain a data object. The first determining unit 504 is configured to determine a first storage node (e.g., node 102a) for storing a first copy of the data object and to determine a second storage node (e.g., node 102b) for storing a second copy of the data object. The providing unit 506 is configured to provide the first copy of the data object to the first storage node and provide the second copy of the data object to the second storage node.

The second determining unit 508 is configured to determine a first compression process for use in compressing the first copy of the data object, and the third determining unit 510 is configured to determine a second compression process for use in compressing the second copy of the data object, wherein the second compression process is different than the first compression process.

The first compression unit 512 is configured to use the first compression process to compress the first copy of the data object, thereby producing a first compressed version of the data object, and the second compression unit 514 is configured to use the second compression process to compress the second copy of the data object, thereby producing a second compressed version of the data object, wherein the second compression process is computationally simpler than the first compression process.

The first storing unit 516 is configured to store the first compressed version of the data object in a first non-transitory computer readable medium, and the second storing unit 518 is configured to store the second compressed version of the data object in a second non-transitory computer readable medium.

Figure 6:
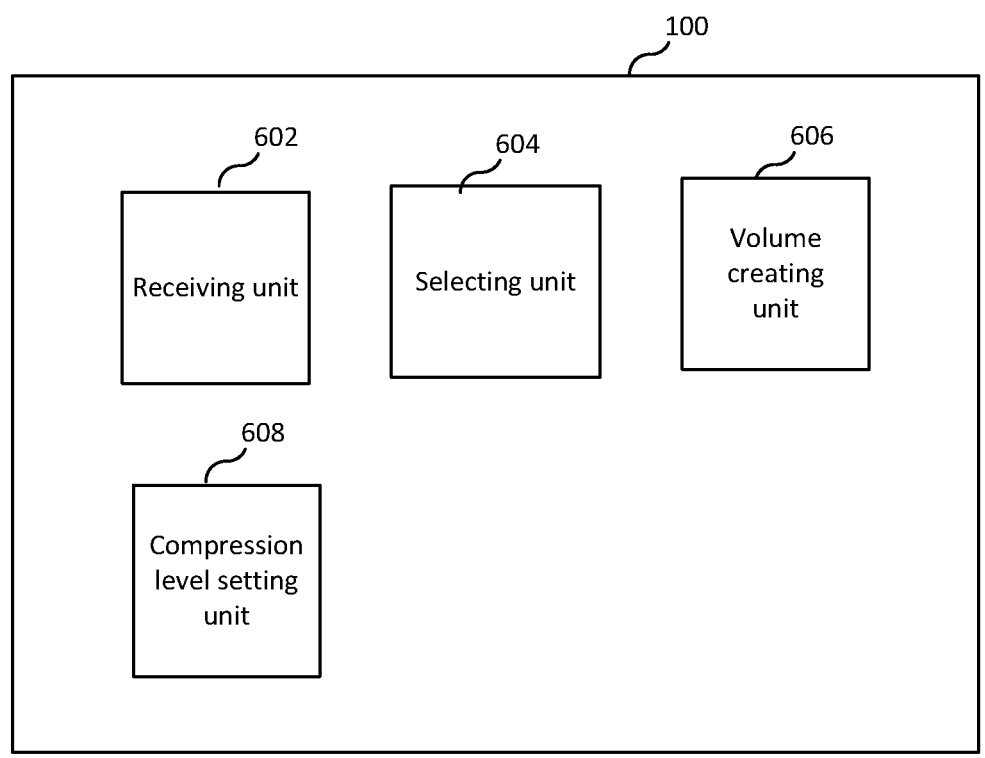
FIG. 6 is a diagram showing functional modules of a data storage system according to some embodiments.

FIG. 6 is a diagram showing functional modules of data storage system 100 according to some embodiments. As shown in FIG. 6, data storage system 100 in some embodiments includes: a receiving unit 602, a selecting unit 604, a volume creating unit 606, a compression level setting unit 608. The receiving unit 602 is configured to receive a storage volume creation request. The selecting unit 604 is configured to select a plurality of storage nodes based on the storage volume creation request, the plurality of storage nodes comprising a first storage node comprising a first set of one or more volumes and a second storage node comprising a second set of one or more volumes, wherein each volume included in the first set of volumes has a compression level and each volume included in the second set of volumes has a compression level. The volume creating unit 606 is configured to create a first new volume on the first storage node and create a second new volume on the second storage node. The compression level setting unit 608 is configured to set a compression level for the first new volume based on the compression levels of the volumes included in the first set of volumes and set a compression level for the second new volume based on the compression levels of the volumes included in the second set of volumes While various embodiments of the present disclosure are described herein (including the appendices, if any), it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A method for redundant storage of a data object, the method being performed by a data storage system comprising a storage controller and a plurality of storage nodes and the method comprising:
    obtaining the data object; and
    in response to obtaining the data object performing a method comprising:
    determining a first storage node for storing a first copy of the data object;
    determining a second storage node for storing a second copy of the data object;
    providing the first copy of the data object to the first storage node; and
    providing the second copy of the data object to the second storage node, wherein the method further comprises:
    the first storage node determining a first compression process for use in compressing the first copy of the data object;
    the second storage node determining a second compression process for use in compressing the second copy of the data object, wherein the second compression process is different than the first compression process;

the first storage node using the first compression process to compress the first copy of the data object, thereby producing a first compressed version of the data object;

the second storage node using the second compression process to compress the second copy of the data object, thereby producing a second compressed version of the data object, wherein the second compression process is computationally simpler than the first compression process;

storing the first compressed version of the data object in a first non-transitory computer readable medium; and storing the second compressed version of the data object in a second non-transitory computer readable medium, wherein the method further comprises:

providing to the first storage node a storage container identifier identifying a storage container, wherein (1) the first storage node uses the storage container identifier to obtain from a first database a first compression process identifier associated with the storage container identifier and (2) the first storage node uses the first compression process identifier to determine the first compression process;

providing to the second storage node the storage container identifier, wherein (1) the second storage node uses the storage container identifier to obtain from a second database a second compression process identifier associated with the storage container identifier and (2) the second storage node uses the second compression process identifier to determine the second compression process.

2. The method of claim 1, wherein the storage container identifier and the first copy of the data object are provided to the first storage node at substantially the same time, and the storage container identifier and the second copy of the data object are provided to the second storage node at substantially the same time.

3. The method of claim 1, further comprising, prior to obtaining the data object, configuring the first storage node and the second storage node, wherein configuring the first storage node comprises causing the first storage node to associate the storage container identifier with the first compression process identifier; and configuring the second storage node comprises causing the second storage node to associate the storage container identifier with the second compression process identifier.

4. The method of claim 1, wherein the method further comprises, prior to providing the first copy of the data object to the first storage node, selecting the first compression process from a set of two or more available compression processes, providing the first copy of the data object to the first storage node comprises transmitting to the first storage node the first copy of the data object and a first compression process identifier identifying the first compression process, and the first storage node determines the first compression process based on the first compression process identifier.

5. The method of claim 4, wherein selecting the first compression process comprises selecting the first compression process based on one or more of: an attribute of the data object, current system resource availability, and predicted system resource availability.

6. The method of claim 1, further comprising:

prior to the first storage node using the first compression process to compress the first copy of the data object, the first storage node determines whether it has sufficient resources to compress the first copy of the data object using the first compression process.

7. The method of claim 1, further comprising:

scanning at least one of the first storage node and the second storage node to identify files requiring compression; and for each identified file requiring compression, compressing the identified file.

8. The method of claim 1, further comprising:

scanning at least one of the first storage node and the second storage node to identify files that have not been accessed since a predetermined prior point in time; and for each identified file that has not been accessed since the predetermined prior point in time, compressing the identified file.

9. The method of claim 1, further comprising:

determining that a storage level of the first storage node has exceeded a storage level threshold, and as a result of determining that the storage level of the first storage node has exceeded the storage level threshold, compressing a file stored in the first storage node to a higher compression level.

10. A computer program product comprising a non-transitory computer readable medium storing a computer program comprising instructions which, when executed on at least one processor, cause the at least one processor to carry out the method of claim 1.

11. A system, system comprising:

a data storage system; and a data processing system coupled to the data storage system, the data processing system comprising one or more processors, wherein the system is configured to perform the method of claim 1.

12. A method for redundant storage of a data object, the method being performed by a data storage system comprising a storage controller and a plurality of storage nodes and the method comprising:

obtaining the data object; and in response to obtaining the data object performing a method comprising:

determining a first storage node for storing a first copy of the data object;

determining a second storage node for storing a second copy of the data object;

providing the first copy of the data object to the first storage node; and providing the second copy of the data object to the second storage node, wherein the method further comprises:

the first storage node determining a first compression process for use in compressing the first copy of the data object;

the second storage node determining a second compression process for use in compressing the second copy of the data object, wherein the second compression process is different than the first compression process;

the first storage node using the first compression process to compress the first copy of the data object, thereby producing a first compressed version of the data object;

the second storage node using the second compression process to compress the second copy of the data object, thereby producing a second compressed version of the data object, wherein the second compression process is computationally simpler than the first compression process;

storing the first compressed version of the data object in a first non-transitory computer readable medium;

storing the second compressed version of the data object in a second non-transitory computer readable medium;

prior to the first storage node using the first compression process to compress the first copy of the data object, the first storage node determines whether it has sufficient resources to compress the first copy of the data object using the first compression process; and as a result of determining that the first storage node does not have sufficient resources to compress the first copy of the data object using the first compression process, the first storage node stores the first copy of the data object in the first non-transitory computer readable medium and, after the first storage node stores the first copy of the data object in the first non-transitory computer readable medium, the first storage node uses the first compression process to compress the first copy of the data object, thereby producing the first compressed version of the data object.

13. A method for redundant storage of a data object, the method being performed by a data storage system comprising a storage controller and a plurality of storage nodes and the method comprising:

obtaining the data object; and in response to obtaining the data object performing a method comprising:

determining a first storage node for storing a first copy of the data object;

determining a second storage node for storing a second copy of the data object;

providing the first copy of the data object to the first storage node; and providing the second copy of the data object to the second storage node, wherein the method further comprises:

the first storage node determining a first compression process for use in compressing the first copy of the data object;

the second storage node determining a second compression process for use in compressing the second copy of the data object, wherein the second compression process is different than the first compression process;

the first storage node using the first compression process to compress the first copy of the data object, thereby producing a first compressed version of the data object;

the second storage node using the second compression process to compress the second copy of the data object, thereby producing a second compressed version of the data object, wherein the second compression process is computationally simpler than the first compression process;

storing the first compressed version of the data object in a first non-transitory computer readable medium;

storing the second compressed version of the data object in a second non-transitory computer readable medium;

receiving a request for the data object;

in response to receiving the request for the data object, selecting a storage node from a set of storage nodes, wherein each storage node included in the set of storage nodes stores a copy of the data object; and retrieving the data object from the selected storage node, wherein the storage node is selected based on one or more of: the compression level at which the data object is stored on the selected storage node and a network access time for accessing the selected storage node.

* * * * *